United States Patent [19]
Heigl

[11] Patent Number: 4,742,980
[45] Date of Patent: May 10, 1988

[54] POSITIONING DEVICE FOR TEST HEADS

[76] Inventor: Helmuth Heigl, Anton-Fahrer-Str. 1, 8208 Pullach-Kolbermoor, Fed. Rep. of Germany

[21] Appl. No.: 883,089

[22] Filed: Jul. 8, 1986

[30] Foreign Application Priority Data

Jul. 8, 1985 [DE] Fed. Rep. of Germany ....... 3524348

[51] Int. Cl.$^4$ ............................................. A47G 29/00
[52] U.S. Cl. ..................................... 248/125; 248/282
[58] Field of Search ............... 248/125, 278, 282, 287, 248/284, 371

[56] References Cited

U.S. PATENT DOCUMENTS

| | | | |
|---|---|---|---|
| 1,114,948 | 10/1914 | Walker | 248/278 X |
| 2,605,069 | 7/1952 | Gillaspy | 248/278 X |
| 3,243,497 | 3/1966 | Kendall et al. | 248/278 X |
| 4,240,603 | 12/1980 | Chiariello | 248/125 |
| 4,421,394 | 12/1983 | Schon et al. | 248/282 X |
| 4,520,981 | 6/1985 | Harrigan | 248/125 X |
| 4,523,256 | 6/1985 | Small | 248/125 X |
| 4,544,120 | 10/1985 | Lowell et al. | 248/278 X |
| 4,592,526 | 6/1986 | Kobelt | 248/278 |
| 4,607,897 | 8/1986 | Schwartz | 248/282 X |

FOREIGN PATENT DOCUMENTS

| | | | |
|---|---|---|---|
| 2419637 | 11/1974 | Fed. Rep. of Germany | 248/278 |
| 0834246 | 11/1938 | France | 248/125 |

Primary Examiner—Ramon O. Ramirez
Attorney, Agent, or Firm—Steele, Gould & Fried

[57] ABSTRACT

A positioning device for test heads, and the like, comprising: an upright stand having legs with leveling mechanisms; a vertically adjustable platform mounted on the stand; two symmetrically arranged pairs of arms mounted on the platform for articulated movement in a horizontal plane; a bracket rotatably mounted to the free end of each arm pair; and, a test head holder tiltably mounted on each bracket for movement about a horizontal axis, a test head being attachable to and between the test head holders, whereby the test head may be vertically, horizontally and tiltably positioned. Clamping devices are provided for locking the test head into place after proper positioning.

8 Claims, 2 Drawing Sheets

POSITIONING DEVICE FOR TEST HEADS

BACKGROUND OF THE INVENTION

1. Field of the Invention

This invention relates generally to the field of fully automated testing systems for integrated circuits and the like, such testing systems being used to conduct quality control tests of electronic structural components. In particular, the invention relates to a positioning device for test heads forming part of such automatic testing systems.

2. Prior Art

During the manufacture of electronic structural components and the like, it is necessary to conduct quality control tests. Such tests are normally conducted by fully automated testing systems which are connected to an integrated circuit sorting system through a test head. The test head is normally connected to the testing system by overhead cables, enabling the test head to be moved into and out of an operative position. Support devices, which are sometimes referred to as test head manipulators, are used to position such test heads over wafer/samplers, and to move such test heads into ergonomically favorable positions to facilitate manual testing of electronic components, as well as adjustments and/or repairs made directly on the test head. Such test heads and the necessary connecting cables can weigh as much as 1,000 newtons, approximately 225 pounds.

In order for the test heads to be properly positioned, it is necessary that a test head manipulator enable or otherwise provide not only height adjustment, but movements in two coordinate directions of a horizontal plane, a rotation in the horizontal plane and a tilting motion around a horizontal axis, as well.

In one such test head manipulator known in the art, the moveable portion of the test head is carried by a vertical member supported by fork-like extending legs. A worm/gear spindle assembly provides for height adjustment and two parallel cylinders enable translation in a horizontal plane. The two cylinders are arranged symmetrically relative to the support, a hinged fitting for the test head being mounted therebetween and manually adjustable. There is no provision for sideways movement, although the test head can be rotated about the vertical axis of the support column and can be tilted around a horizontal axis. Test heads of differing width can be accommodated only by changing the brackets which provide for the horizontal motion. Such construction limits accessibility to the back of the test heads.

Another known manipulator comprises a vertical column or standard of C-shaped cross section, being open on one side. The test head carrier is clamped on a cylinder, the cylinder being mounted on the column. The test head carrier is shaped as a rigid bracket and is adjustable by a three-way flexibly arranged carrier bracket construction in the horizontal plane. Test heads of differing width can be accommodated only by an exchange of the rigid bracket or by the insertion of adaptors between the bracket and test head. Accessibility to the back of the test head is also limited, due to the bracket design and the compact construction of the carrier bracket.

SUMMARY OF THE INVENTION

It is an object of this invention to provide a test head manipulator or positioning device which enables the safe and simple positioning of heavy test heads, which can easily be adapted for use with test heads of differing width and which provides easy access to the back of the test head.

This and other objects of the invention are achieved by a positioning device for test heads wherein the rigid bracket of the prior art is replaced by a symmetrically arranged pair of articulated arms. Each of the arms comprises segments attached together at three joints. The two arms are mounted to a vertically adjustable cross head or platform at one end and to an integrated tilting device at the other end, the tilting device being held between distal ends of each bracket. The symmetrically arranged hinged bracket pair enables the necessary translation and rotational movement of the test head in a horizontal plane. It is also possible to tilt the test head about a horizontal axis without having to change the horizontal position. Further, elimination of the rigid bracket enables easy access to the back of the test head. Moreover, none of the components protrude or project beyond the plane defined by the connector for the test head.

In an alternative embodiment, the device may be provided with a swivel joint located near an axis running through the center of gravity of the test head, which enables still further adjustment. A second swivel joint, placed for example along the axis vertical to the supporting plane expands the possibilities for adjustment of the test head even more.

Generally speaking, the invention may be thought of as a positioning device for test heads, and the like, comprising: an upright standing having leveling means; a vertically adjustable platform mounted on the stand; two symmetrically arranged arms mounted on the platform for articulated movement in a horizontal plane; a bracket rotatably mounted to the distal end of each arm; and, a test head holder tiltably mounted on each bracket for movement about a horizontal axis, a test head being attachable to and between the test head holders, whereby the test head may be vertically, horizontally and tiltably positioned. The invention may also be thought of as a positioning device for test heads, and the like, comprising: an upright stand having leveling means; a vertically adjustable platform mounted on the stand; two symmetrically arranged articulatable sets of three arm segments each, the segments in each set being rotatably mounted to the platform and to one another by joints having vertical axes, each set having a free end moveable in a horizontal plane; a test head holder tiltably mounted on the free end of each of the arms for movement about a horizontal axis, a test head being attachable to and between the test head holders, whereby the test head may be vertically, horizontally and tiltably positioned. Each of the three joints in each arm set has a vertical axis.

BRIEF DESCRIPTION OF THE DRAWINGS

A presently preferred embodiment of the invention is shown in the attached drawings, wherein.

DETAILED DESCRIPTION OF THE PREFERRED EMBODIMENTS

Figure 1:
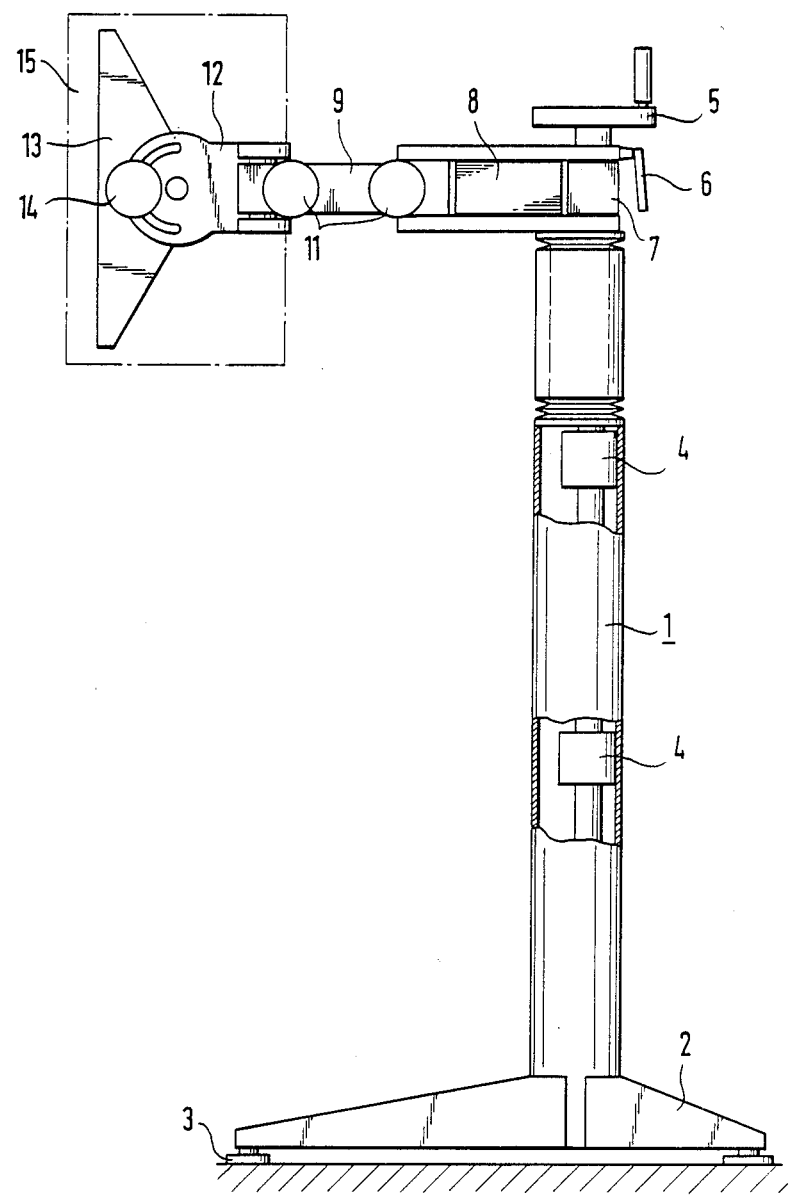
FIG. 1 is a side elevation of a positioning device for a test head according to this invention; and, FIG. 2 is a top plan view of the positioning device shown in FIG. 1.
Figure 2:
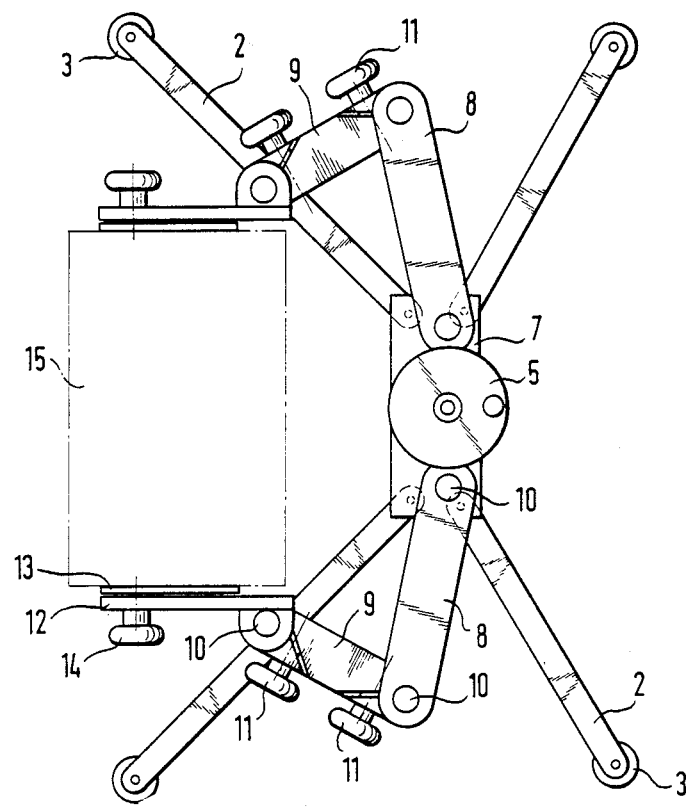

A support column 1 is held in a vertical position on a floor by legs 2, each of which is provided with support disc 3 enabling vertical adjustment to level the device and compensate for irregularities in the floor surface. Each of the legs 2 is attached to the support or column 1 at a wider end and tapers to a narrower, distal end at which the support disc 3 is attached. The support or column 1 has a parallel guide therein with linear bearings 4 and a threaded spindle with a crank 5, for adjusting the height of the test head. The threaded spindle is disposed on a cross head or platform 7. The spindle can be locked into position by movement of the lever handle 6 of a locking screw.

Two double-link pivot arms mounted on cross head or platform 7. Hinged brackets or arm segments 8 are rotatably mounted directly on cross head or platform 7 by joints 10. The other end of each hinged bracket 8 is rotatably connected to one end of a hinged bracket or arm segment 9, each by another rotatable joint 10. The hinged brackets can be clamped in place at the joints by locking screws 11. The joints are provided with bearings permitting easy rotation without undesirable freedom or play. A hinged fitting 12 is rotatably connected to each hinged bracket 9 by another joint 10. The test head 15 is adapted for attachment to the hinged fitting 12, the test head being pivotable throughout a range of 180 degrees wtihin the hinged fitting 12 about a horizontal axis in armature 13. Locking screws 14 extend through a semi-annular guide groove for locking the test head in any selected pivotal position. Each of the joints preferably comprises needle bearings, preferably needle roller bearings. Each joint is preferably constructed to substantially eliminate free play.

If, for example, a test head is to be connected to an integrated circuit automatic sorting machine, the test head manipulator is positioned behind the automatic sorting machine and is mounted on spread apart legs 2 and leveled by support discs 3. The hinged brackets 8, 9 are moved sideways and the test head is connected with the armature 13. Subsequently, the test head is moved behind the place of contact of the automatic sorting machine. The height is adjusted by spindle 5. The test head can be moved horizontally in the plane to the point of contact by loosening locking screws or clamps 11. The position of the test head relative to the horizontal axis is achieved by movement of the test head within the guide groove of armature 13, the test being locked in place by clamp or locking screw 14. Once appropriate contact with the automatic sorting machine has been made, the position of the test head may be secured or further adjusted by operation of clamps or locking screws 6, 11 and 14.

A swivel joint may also be located near the axis running through the center of gravity of the test head in order to provide for further articulation and adjustment.

What is claimed is:

1. A positioning device for test heads, and the like, comprising:
    an upright stand having leveling means;
    a vertically adjustable platform mounted on the stand;
    two symmetrically arranged arms mounted on the platform for articulated movement in a horizontal plane, the arms having segments articulated to one another at joints;
    a bracket being rotatably mounted to the distal end of each arm; and,
    a test head holder tiltably mounted on each bracket for movement about a horizontal axis, a test head being attachable to and between the test head holders,
    whereby the test head may be vertically, horizontally and tiltably positioned.

2. A positioning device according to claim 1, further comprising means for locking the pairs of arms and the test head holders in fixed positions.

3. A positioning device according to claim 1, wherein each of the joints comprises needle roller bearings.

4. A positioning device according to claim 1, wherein the joints comprise means for substantially eliminating free play.

5. A positioning device for test heads, and the like, comprising:
    an upright stand having leveling means;
    a vertically adjustable platform mounted on the stand;
    two symmetrically arranged articulatable sets of three arm segments each, the arm segments in each set being rotatably mounted to the platform and to one another by joints having vertical axes, each set forming an arm having a free end moveable in a horizontal plane; and,
    a test head holder tiltably mounted on the free end of each of the arms for movement about a horizontal axis, a test head being attachable to and between the test head holders,
    whereby the test head may be vertically, horizontally and tiltably positioned.

6. A positioning device according to claim 5, further comprising means for locking the sets of arm segments and the test head holders in fixed positions.

7. A positioning device according to claim 5, wherein each of the joints comprises needle roller bearings.

8. A positioning device according to claim 5, wherein the joints comprise means for substantially eliminating free play.

* * * * *